(12) United States Patent
Sanchez et al.

(10) Patent No.: US 7,135,934 B2
(45) Date of Patent: Nov. 14, 2006

(54) FULLY PROGRAMMABLE PHASE LOCKED LOOP

(75) Inventors: Hector Sanchez, Cedar Park, TX (US);
Carlos A. Greaves, Austin, TX (US);
Jim P. Nissen, Austin, TX (US);
Xinghai Tang, Cedar Park, TX (US)

(73) Assignee: Freescale, Semiconductor, Inc., Austin, TX (US)

( * ) Notice: Subject to any disclaimer, the term of this patent is extended or adjusted under 35 U.S.C. 154(b) by 98 days.

(21) Appl. No.: 11/069,664

(22) Filed: Mar. 1, 2005

(65) Prior Publication Data

US 2006/0197608 A1    Sep. 7, 2006

(51) Int. Cl.
H03L 7/089 (2006.01)
H03L 7/099 (2006.01)

(52) U.S. Cl. ............................. 331/18; 331/17; 331/57; 331/179

(58) Field of Classification Search ................. 331/1 A, 331/8, 17, 18, 25, 57, 177 R, 179; 327/156–159
See application file for complete search history.

(56) References Cited

U.S. PATENT DOCUMENTS

| | | | |
|---|---|---|---|
| 6,441,660 B1 * | 8/2002 | Ingino, Jr. | ................... 327/156 |
| 6,624,674 B1 | 9/2003 | Zhao | |
| 6,693,496 B1 | 2/2004 | Lebouleux | |
| 6,741,102 B1 | 5/2004 | Thomas | |
| 6,831,485 B1 | 12/2004 | Lee et al. | |
| 6,844,762 B1 | 1/2005 | Sanchez | |

OTHER PUBLICATIONS

A new fast-settling gearshift adaptive PLL to extend loop bandwidth enhancement in frequency synthesizers Yiwu Tang; Ismail, M.; Bibyk, S.; Circuits and Systems, 2002. ISCAS 2002L IEEE International Symposium on, vol. 4, May 26-29, 2002 pp. IV-787-IV-790 vol. 4.

A low-noise fast-lock phase-locked loop with adaptive bandwidth control Joonsuk Lee; Beomsup Kim; Solid-State Circuits, IEEE Journal of, vol 35, Issue: 8, Aug. 2000 pp. 1137-1145.

Fast locking scheme for PLL frequency synthesiser Liu, L.C.; Li, B.H.; Electronic Letters, vol. 40, Issue: 15, Jul. 22, 2004 pp. 918-920.

A CMOS PLL using current-adjustable charge-pump and on-chip loop filter with initialization circuit; Zhao Hui; Ren Junyan, Zhang Qianling; ASIC, 2003. Proceedings. 5th International Conference on, vol. 2, Oct. 21-24, 2003 pp. 728-731 vol. 2.

(Continued)

*Primary Examiner*—David Mis
(74) *Attorney, Agent, or Firm*—Gary R. Stanford (57) ABSTRACT

A programmable PLL including a receiver, a phase frequency detector, a charge pump, and a VCO. The receiver includes a programmable capacitor voltage divider that shifts voltage of an input clock to provide a level-shifted clock. The AC interface includes a state detection and correction circuit that ensures proper state of the level-shifted clock. The PLL includes a pulse delay modulator for generating delayed clock control signals. The VCO includes a programmable phase control circuit that dynamically adjusts phase using the delayed clock control signals. The VCO circuit includes a ring oscillator circuit with one or more phase control nodes. The programmable phase control circuit selectively couples devices to the phase control node using the clock control signals to adjust phase. The devices may be capacitors or transistors, each switched using switches controlled by the delayed clock control signals. The capacitors may be metal capacitors or semiconductor transistor capacitors.

30 Claims, 7 Drawing Sheets

OTHER PUBLICATIONS

Methodology for on-chip adaptive jitter minimization in phase-locked loops; Mansuri, M.; Hadiashar, A.; Chih-Kong Ken Yang; Circuits and Systems II: Analog and Digital Signal Processing, IEEE Transactions on [see also Circuits and Systems II: Express Briefs, IEEE Transactions on], vol. 50, Issue: 11, Nov. 2003 pp. 870-878.

* cited by examiner

FULLY PROGRAMMABLE PHASE LOCKED LOOP

BACKGROUND OF THE INVENTION

1. Field of the Invention

The present invention relates in general to electronic devices and specifically to a fully programmable phase locked loop.

2. Description of the Related Art

Phase locked loops (PLLs) are utilized by electronic devices to generate clock signals from a reference signal. The generated clock signal maybe at the same frequency as the reference clock signal or at a fractional or multiple frequency of the reference clock signal. The generated clock signal typically has a predetermined phase relationship with the reference clock signal.

A typical PLL includes a phase frequency detector (PFD), a charge pump, and a voltage controlled oscillator (VCO), among other supporting circuitry. The PFD compares an input or system clock with an output clock and provides clock control signals to the charge pump. The charge pump adds or subtracts charge to a filter capacitor based on the clock control signals and generates a control voltage that controls the frequency of the VCO. Another block may be provided to buffer and divide or multiply the output clock, which is fed back to the PFD for comparison with the system clock.

The conventional PLL architecture is not ideal for newer process technologies, does not scale well from one process technology to the next, and must be redesigned for use in various electronic devices in different markets. The drive to reduce the size of electronic devices has increased the difficulty of implementing capacitors in a semiconductor device. In particular, reducing the thickness of gate oxides increases the gate leakage currents of semiconductor capacitor devices. Also, reducing the size of semiconductor devices means that a proportionally larger area of the device must be allocated to obtain the same capacitance, unless the thickness of the insulator is reduced. Reducing the thickness of the insulator, however, increases the leakage currents of the semiconductor capacitor devices.

The transistors implemented using advanced CMOS processes, such as 90-nm (nanometer) CMOS, are exhibiting non-ideal behavioral traits for implementation of critical analog functions, such as current and voltage sources or references, VCO's, charge pumps, etc. Some of these non-ideal transistor traits include increased gate tunneling current, increased drain-source leakage, reduced voltage headroom due to VDD scaling, and increased noise susceptibility due to decreased threshold voltages. Furthermore, with respect to PLL design, the very high gain VCOs are causing increased cycle-to-cycle jitter, coupled with increased phase drift due to the ever increasing discrepancy between the internal speed of the processor and the interface reference clock speeds. Modern processors, for example, typically operate in the gigahertz (GHz) range whereas the interface reference clock speeds typically operate in the 16–166 megahertz (MHz) range. Fully digital PLLs can alleviate some of the issues but do not scale very well. Furthermore, the need to integrate more PLLs on chip for System-On-Chip (SOC) applications forces more unique PLL implementations which cause design overhead and risk.

A receiver or level shifter is used at the front end of the PLL to interface with clocks that may be generated at different voltage levels. The clocks oscillate at different voltage levels and with different slopes on the rising and falling edges, and thus are difficult to match for de-skew control. Older process technologies were designed for higher voltages, such as 1.5 Volts (V), 18.V, 2.5V, 3.3V, etc., whereas newer technologies are designed for use with lower voltage levels, such as on the order of 1–1.2V. Dual-Gate Oxide (DGO) or "thick-gate" transistors are used to withstand the higher voltage levels, but do not operate well at the lower voltage levels. Single-Gate Oxide (SGO) or "thin-gate" transistors are smaller and faster and optimized for low voltage operation, but are unable to handle the higher voltage levels. In other configurations, the faster path using thin-gate devices was interfaced to higher voltage devices for delay matching with the higher voltage reference or system clock, effectively slowing down the front end interface. Also, such interface to higher voltage devices was a less than optimal solution that complicated skew control and that was difficult to optimize when the PLL was required to operate over a wide range of supply voltage.

It is desired to provide a single programmable PLL that is scalable across design technologies, that addresses multiple market needs, that provides multi-bandwidth and phase control, and that provides complete control of the damping coefficient and natural frequency of the PLL. For example, it is desired to provide a programmable PLL front end to interface a reference clock at any of a variety of voltage levels without slowing down either clock. More particularly, it is desired to match the levels of and to provide de-skew control between the reference and feedback clocks without slowing down either path. Furthermore, it is desired to provide a VCO with dynamically adjusted phase control that does not use traditional resistor or current source devices and that does not rely on the accurate resistor, capacitor or transistor absolute values.

BRIEF DESCRIPTION OF THE DRAWINGS

The benefits, features, and advantages of the present invention will become better understood with regard to the following description, and accompanying drawing in which.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

Figure 1:
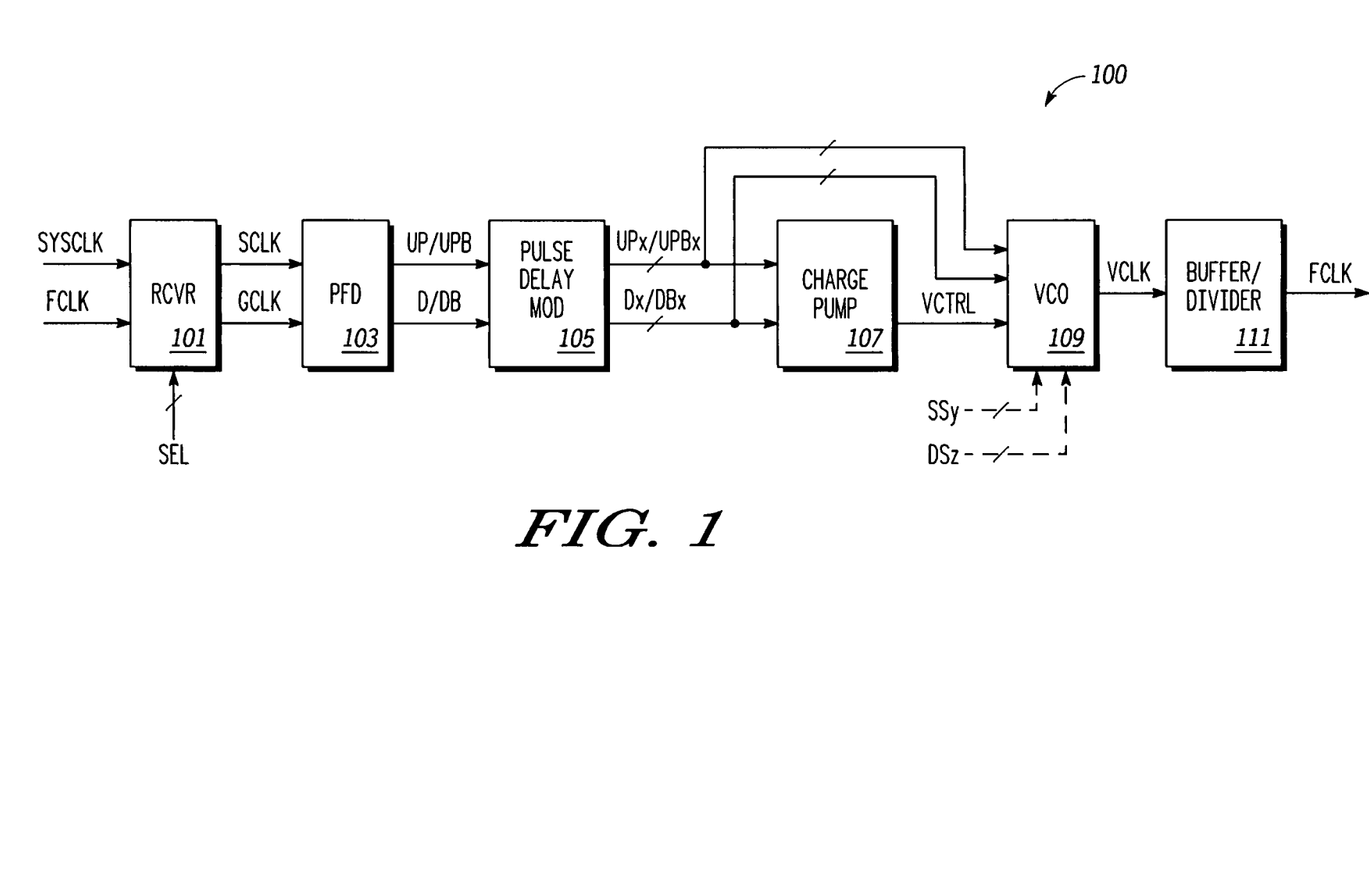
FIG. 1 is a block diagram of a phase locked loop (PLL) implemented according to an exemplary embodiment of the present invention.

FIG. 1 is a block diagram of a phase locked loop (PLL) 100 implemented according to an exemplary embodiment of the present invention. The PLL 100 includes an output for providing an output clock signal (FCLK) that may be at the same frequency, a fractional frequency, or multiple frequency of a reference or system clock signal referred to as SYSCLK. The SYSCLK and FCLK signals are provided to respective inputs of a receiver (RCVR) circuit 101 at the input of the PLL 100. The receiver circuit 101 selectively shifts the voltage level of the SYSCLK signal down to the level of the FCLK signal, as further described below, and provides equal level clock signals SCLK and GCLK, respectively. The receiver circuit 101 also provides programmable skew control between the SYSCLK and FCLK signals, although such skew control is not further described as not necessary for a full understanding of the present invention. In the embodiment shown in FIG. 1, the receiver circuit 101 receives one or more select signals SEL, which are employed to shift the voltage level of the SYSCLK signal relative to the FCLK signal as further described below. The SCLK and GCLK signals are provided to respective inputs of a phase frequency detector (PFD) circuit 103. Based upon a comparison of the SCLK and GCLK signals, the PFD circuit 103 generates up (UP) and down (D) clock control signals, which collectively indicate the frequency and phase relationship between the SCLK and GCLK signals as understood by those of ordinary skill in the art. The PFD circuit 103 also generates and provides inverse versions of the UP and D signals, shown as UPB and DB signals, respectively, where a "B" appended at the end of a signal name denotes logical negation or signal inversion unless otherwise indicated.

The UP/UPB and D/DB signals are provided to a pulse delay modulation circuit 105, which generates and provides multiple up signals UPx and UPBx and multiple down signals Dx and DBx. The "x" appended to the signal name denotes an index value from zero (0) to a number "N", where N is any integer value selected for the particular implementation or configuration. Thus, for example, if N is 2, then x is 0, 1 and 2, and the pulse delay modulation circuit 105 generates up and down complementary signal pairs UP0/UPB0 and D0/DB0, UP1/UPB1 and D1/DB1, and UP2/UPB2 and D2/DB2. In the embodiment shown, the UP/UPB and D/DB effectively pass unmodified through the pulse delay modulation circuit 105 and become the UP0/UPB0 and D0/DB0 signals. One or more sets of the complementary signal pairs (e.g., UP0/UPB0 and D0/DB0) are provided to a capacitive charge pump 107, which generates a frequency control signal VCTRL across a filter capacitor (not shown) for adjusting the frequency of the FCLK signal. In general, the charge pump 107 applies charge to the filter capacitor in response to asserted up signals and removes charge from the filter capacitor in response to asserted down signals. The VCO 109 receives the VCTRL signal and provides at its output a clock signal VCLK having a frequency that is controlled by the voltage level of the VCTRL signal. The UPx, UPBx, Dx and DBx clock control signals are also provided to the VCO 109 for phase control of the VCLK signal, as further described below. In some embodiments, the VCO 109 includes selectable phase control stages each selected by a corresponding one of multiple stage select signals SSy provided to the VCO 109 (shown as dashed lines), where "y" is an index from 1 to the number of programmable stages included. In addition or in the alternative, the VCO 109 includes selectable load capacitors each selected by a corresponding one of multiple load capacitor select signals DSz provided to the VCO 109 (shown as dashed lines), where "z" is an index from 1 to the number of programmable load capacitors included. In the embodiment of FIG. 1, the VCLK signal is provided to a buffer and frequency divider circuit 111 that selectively divides the frequency of VCLK to produce the output FCLK signal fed back to the input of the PLL 100.

In one embodiment, the PLL 100 is implemented in an integrated circuit (IC) utilizing CMOS technology including advanced CMOS processing technology. The PLL 100 is optionally integrated with other devices which utilize the PLL 100 such as, for example, a processor and any other processor support circuitry (not shown). With other embodiments, the circuits of the PLL 100 are optionally implemented with other types of circuitry including, for example, with silicon on insulator (SOI) transistors or with discrete components. As described more fully below, the PLL 100 is implemented as a single, fully programmable PLL with improved level-shifting and phase correction for advanced CMOS technologies, such as 90 nm CMOS and the like, and is particularly useful for multiple purpose SOC architectures.

Figure 2:
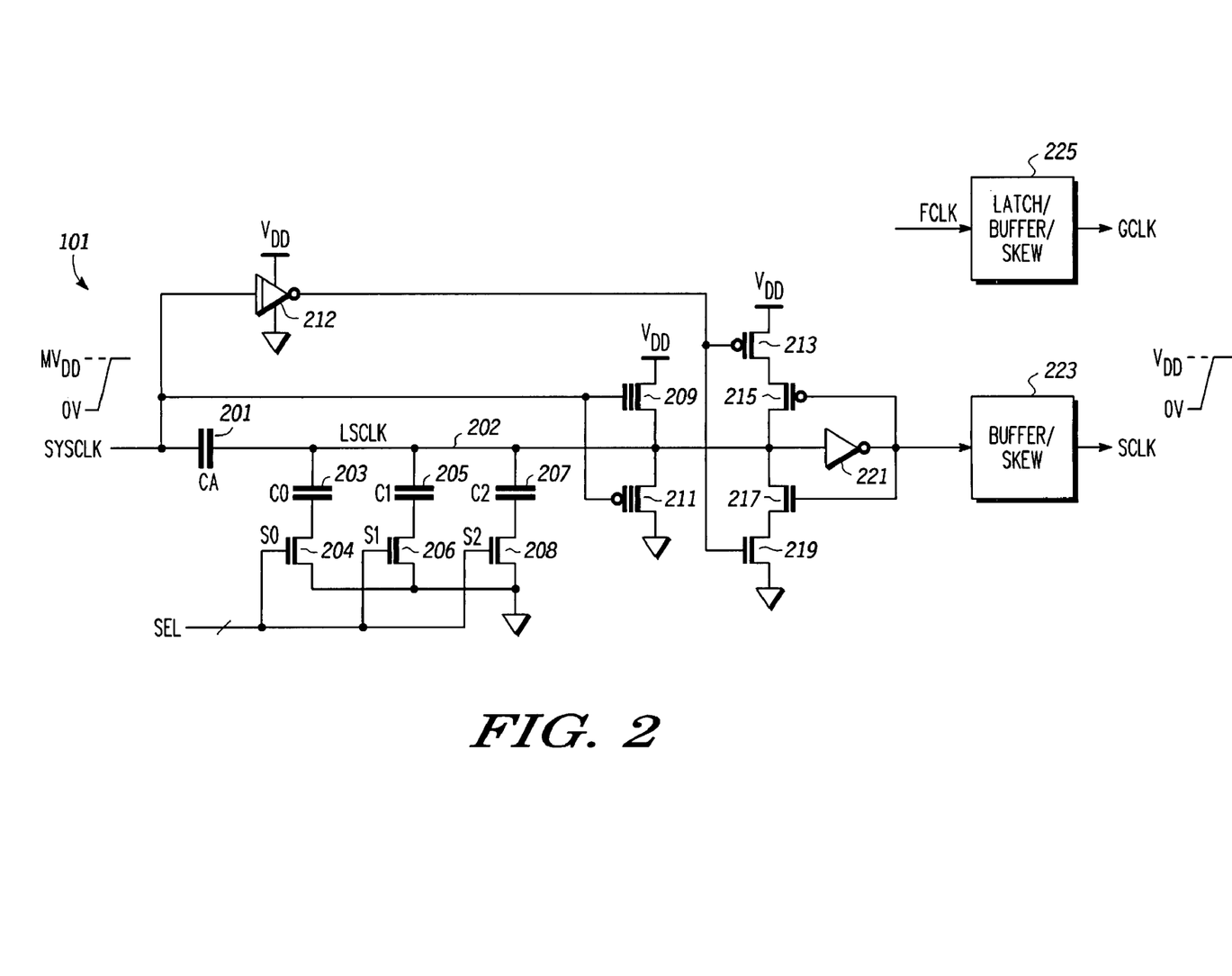
FIG. 2 is a schematic and block diagram of the receiver circuit of FIG. 1 implemented according to an exemplary embodiment of the present invention.

FIG. 2 is a schematic and block diagram of the receiver circuit 101 implemented according to an exemplary embodiment of the present invention. The SYSCLK signal is provided to one terminal of a capacitor 201, having its other terminal coupled to a node 202 developing a level-shifted clock signal referred to as LSCLK. SYSCLK is shown as switching between 0V and MVDD whereas SCLK switches between 0V and VDD, where "M" is a multiple or factor value indicating a different voltage relative to VDD. Node 202 is further coupled to one or more switched-capacitor circuits for selectively shifting the voltage of the SYSCLK signal to the voltage level of the FCLK signal. In the embodiment shown, node 202 is coupled to one terminal of each of capacitors 203, 205 and 207. The other terminals of the capacitors 203, 205 and 207 are coupled to the respective drains of N-channel transistors 204, 206 and 208, each having its source coupled to a reference supply node, such as ground (GND) in the illustrated embodiment. The gates of the transistors 204, 206 and 208 receive binary select signals S0, S1 and S2, respectively, which collectively form the SEL signals. In this manner, the SEL signals are asserted to selectively level shift the voltage of the SYSCLK signal to equalize the voltage levels of the LSCLK and FCLK signals.

The SYSCLK signal is also provided to the gates of an N-channel transistor 209 and a P-channel transistor 211. The transistor 209 has its drain coupled to a supply voltage VDD and it source coupled to the node 202, and the transistor 211 has its source coupled to node 202 and its drain coupled to GND. The SYSCLK signal is also provided to the input of an inverter 212, having its output coupled to the gate of a P-channel transistor 213 and to the gate of an N-channel transistor 219. The source of transistor 213 is coupled to VDD and its drain is coupled to the source of a P-channel transistor 215, having its drain coupled to node 202. Node 202 is coupled to the input of an inverter 221 and to the drain of an N-channel transistor 217, having its source coupled to the drain of transistor 219, which has its source coupled to GND. The output of the inverter 221 is coupled to the gates of transistors 215 and 217 and to the input of a buffer and skew logic circuit 223. The buffer and skew logic circuit 223 has an output providing the SCLK signal, which is a level-shifted version of the SYSCLK signal. The FCLK signal is separately provided to the input of a latch, buffer and skew logic circuit 225, having an output providing the GCLK signal. The SCLK and GCLK clock signals may have the same polarity or be inverted relative to the SYSCLK and FCLK signals. The buffer and skew logic circuit 223 provides further buffering and optional skew functions of the SCLK signal relative to the GCLK signal. The latch, buffer and skew logic circuit 225 and the buffer and skew logic circuit 223 perform similar buffer and skew functions although the circuit 225 may perform additional latching functions.

The capacitors 201–207 collectively form a programmable AC interface that level-shifts the voltage of SYSCLK down to the voltage level of the FCLK signal. In the embodiment illustrated, the AC interface is configured as a capacitive voltage divider. The relative values of the capacitors 201, 203, 205 and 207 are chosen to shift the voltage level of the SYSCLK to the voltage of the FCLK signal. The capacitors 201, 203, 205 and 207 are shown as having capacitances CA, C0, C1 and C2, respectively. A selected or programmed capacitance CS represents the combined capacitance of the capacitors C0–C2 as selected by the SEL signals S0–S2, where CS=C0 if only capacitor 203 is selected, CS=C1 if only capacitor 205 is selected, CS=C2 if only capacitor 207 is selected, CS=C0+C1 if capacitors 203 and 205 are selected, CS=C0+C1+C2 if all of the capacitors 203, 205 and 207 are selected, and so on. The amount of shift of the SYSCLK signal to the LSCLK signal as based on a capacitive voltage divider according to the following equation 1:

$$LSCLK/SYSCLK = CA/(CA+CS) \qquad (1)$$

where the relative capacitance of CA to the capacitance CS of the selected capacitors determines the amount of level shift of SYSCLK to LSCLK. The relative capacitances CA and C0–C2 are chosen to provide various and selectable level shifting values for various configurations. The particular number of switched capacitor circuits illustrated, namely three, is exemplary only and it is understood that any number of switched capacitor circuits are contemplated, including less than three (one or two) or any practicable number greater than three. A binary-weighted set of capacitors is contemplated to program multiple equal steps within a predetermined range of capacitance as known to those skilled in the art.

In one exemplary configuration, the FCLK signal has a voltage level of 1.2V suitable for SGO CMOS transistors and the SYSCLK assumes any one of a range of voltages 1.2V, 1.5V, 1.8V, 2.5V or 3.3V. If the PLL 100 is implemented in a 1.2V system in which the SYSCLK signal is also at 1.2V and already at the same level as FCLK, then SEL is set to logic 000b (where the appended "b" denotes a binary number) so that none of the capacitors 203, 205 and 207 are switched in and the LSCLK assumes the same level as the SYSCLK signal (and thus the FCLK signal). Otherwise, the SEL signals are asserted to the appropriate value to select a suitable combination of the capacitors 203, 205 and 207 to shift the level between the SYSCLK and LSCLK signals from any one of the higher voltage levels down to the level of the FCLK signal.

Because the capacitance CA of the capacitor 201 is used as a ratio of a selected combination of the capacitances C0–C2 of the capacitors 203, 205 and 207, a reduction in device technology does not require an increase in the percentage of the area of a device needed to implement the capacitors. With some embodiments, the capacitors 201, 203, 205 and 207 are sized such that they are equal to or a relatively small factor of the minimum capacitor size that can be reliably manufactured for the device technology size. With some decreasing technologies sizes, the minimal capacitor size may be reduced, so that the sizes of the capacitors 201, 203, 205 and 207 are also reduced with such technologies. Consequently, a reduction in device technology size may allow for a reduction in the total area required for these capacitors.

In one embodiment, the capacitors 201, 203, 205 and 207 are metal capacitors having metal comb structure that spans multiple metal levels in an integrated circuit implementing phase locked loop 100. Metal capacitors are more controllable and stable from within a given process and from one process to the next as compared to semiconductor capacitors. Semiconductor capacitors, for example, have capacitances that vary with temperature (e.g., subject to PVT or process voltage temperature), that vary with voltage applied, that vary from one process to the next, and that vary across devices implemented with the same process. However, in other embodiments, the capacitors may be made from semiconductor transistors that are configured as capacitors or may be implemented by other techniques. For example, these capacitors may be implemented with MOS transistors having their drains and sources coupled to their substrates to implement MOS capacitors.

The transistors 209–219 and the inverters 212 and 221 collectively form a state detection and correction circuit that ensures proper state of the LSCLK signal. As understood by those skilled in the art, the capacitor 201 potentially renders the state of the node 202 developing the LSCLK signal indeterminate under certain conditions, including initialization (e.g., startup, reset, power-up, etc.). The pull-up and pull-down transistors 209 and 211 form a latch circuit which pulls the LSCLK signal high to VDD when the SYSCLK signal is high and low to GND when the SYSCLK signal is low. In the embodiment shown, the supply voltage VDD is at a lower voltage level, such as 1V or 1.2V. Since the SYSCLK signal is at a higher voltage level, such as 3.3V, the transistors 209 and 211 are implemented as DGO devices (as shown with double line gates). The DGO transistors 209 and 211 are configured to handle the higher voltage level of the input SYSCLK signal, but nonetheless switch node 202 at the lower voltage range between GND and VDD. The inverter 212 is also implemented with DGO devices (shown with double line input) since receiving the SYSCLK signal, and also switches its output at the lower voltage range between GND and VDD.

The stack of transistors 213, 215, 217 and 219 are each configured as SGO devices and also operate as latches to pull node 202 up to VDD or down to GND. When the SYSCLK signal is low and assuming LSCLK is low, switches 217 and 219 are turned on to pull node 202 low.

When the SYSCLK signal is high and assuming LSCLK is also high, switches 213 and 215 are turned on to pull node 202 high. Yet if for any reason the LSCLK signal assumes the opposite state as the SYSCLK signal, then the inverter 221 disables an operative one of the transistors 215 or 217 to allow the latch formed by the transistors 209 and 211 to pull node 202 back to the proper state. The inverter 212 and the transistors 209 and 211 are the only devices implemented using DGO devices, and are only used to detect and correct the DC state of the AC-coupled node 202, if necessary, and are thus not directly in the signal path from SYSCLK to SCLK. The remaining devices, including transistors 204, 206, 208, 213, 215, 217 and 219 and the inverter 221, are implemented with SGO devices to optimize speed and performance and to minimize power consumption.

The receiver circuit 101 includes a programmable AC interface which interfaces a wide range of voltages employed by different process technologies. In one embodiment, the receiver circuit 101 handles voltages anywhere in the range of 1 to 4 Volts (V) without relying on DGO transistors matching to SGO transistors or other thin oxide devices for skew control. In particular, the receiver circuit 101 provides a seamless AC interface to various voltage levels without the need for high voltage transistors to define the delay matching capability of the PLL 100 for obtaining zero skew. This provides improved scalability of design across multiple technologies and a single PLL configuration which addresses multiple market needs. The state detection and correction circuit ensures that the programmable AC interface remains in the proper state during initialization and during all operating conditions.

Figure 3:
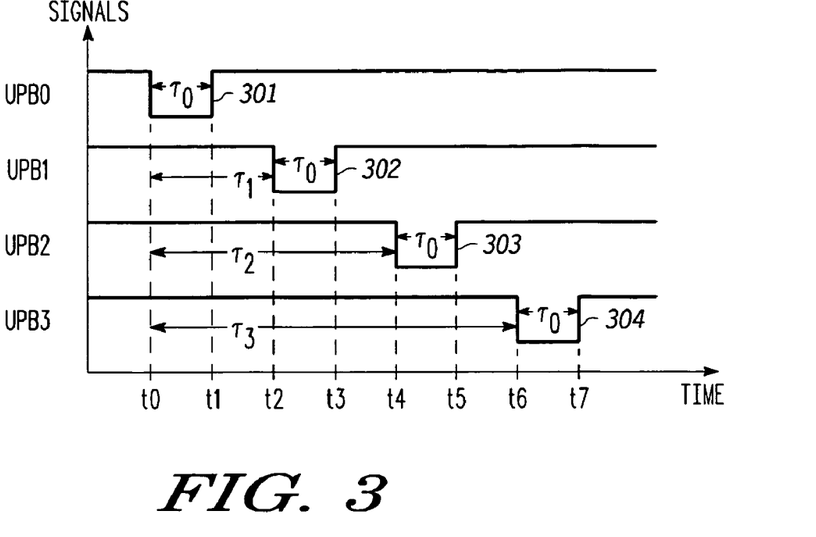
FIGS. 3 and 9 are timing diagrams illustrating operation of the pulse delay modulator of FIG. 1 according to an exemplary embodiment of the present invention illustrating delayed and chopped pulses, respectively.

FIG. 3 is a timing diagram illustrating operation of the pulse delay modulator 105 according to an exemplary embodiment of the present invention illustrating delayed pulses. Preliminarily, it is noted that the UP/UPB and D/DB signals may be provided directly to the charge pump 107 and the VCO 109 without any delayed pulses. The pulses from the PFD 103 may be used to both synchronize frequency and to dynamically adjust pulse width. The additional delayed pulses from the pulse delay modulator 105 are used for improved and more precise phase compensation control. As shown in FIG. 3, N is three and only the inverted up signals are plotted, including signals UPB0, UPB1, UPB2 and UPB3. The corresponding up signals UPx are inverted versions of those shown. The first pulse 301 on UPB0 starts at time t0 and ends at time t1 with a relatively narrow pulse duration of τ0 beginning at time t0. The next pulse 302 occurs on UPB1 (between times t2 and t3) with the same duration of τ0 but delayed by delay τ1 which is greater than τ0. The next pulse 303 occurs on UPB2 (between times t4 and t5) with the same duration of τ0 but delayed by delay τ2 which is greater than τ1+τ0. The last pulse 304 occurs on UPB3 (between times t6 and t7) with the same duration of τ0 but delayed by delay τ3 which is greater than the duration τ2+τ0.

Figure 9:
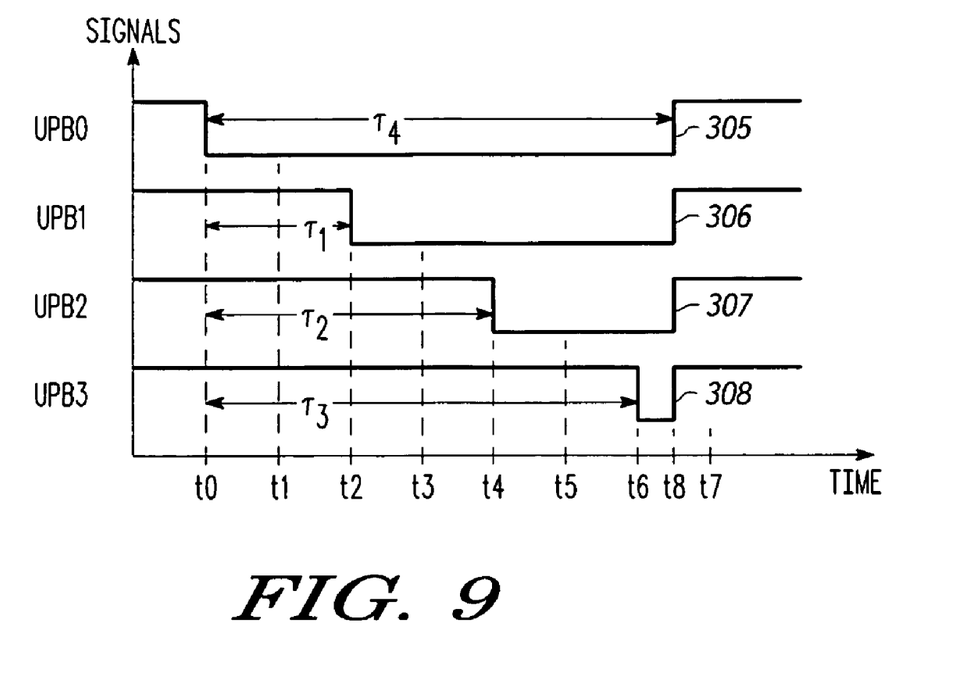

FIG. 9 is a timing diagram illustrating operation of the pulse delay modulator 105 according to an exemplary embodiment of the present invention illustrating delayed and chopped pulses. In this case, N is again three and the inverted up signals are again plotted, including signals UPB0, UPB1, UPB2 and UPB3. The first pulse 305 on UPB0 again starts at time t0 but ends instead at time t8, which occurs after time t6 but before time t7, so that the first pulse 305 has a relatively wide pulse duration shown as τ4. The next pulse 306 occurs on UPB1 and begins at time t2 similar to pulse 302. The pulse 306 would otherwise have the same duration of τ4 as the pulse 305, but instead is "chopped" at time t8 and thus cut short coincident with the end of the first pulse 305. The next pulse 307 occurs on UPB2 and begins at time t4 similar to pulse 303, but again is "chopped" at time t8 and thus cut short coincident with the end of the first pulse 305. The last pulse 308 occurs on UPB3 and begins at time t6 similar to pulse 304, but again is "chopped" at time t8 and thus cut short coincident with the end of the first pulse 305. The use of the pulse delay modulator 105 enables the implementation of dynamic bandwidth and dynamic damping coefficient for a PLL system.

Figure 4:
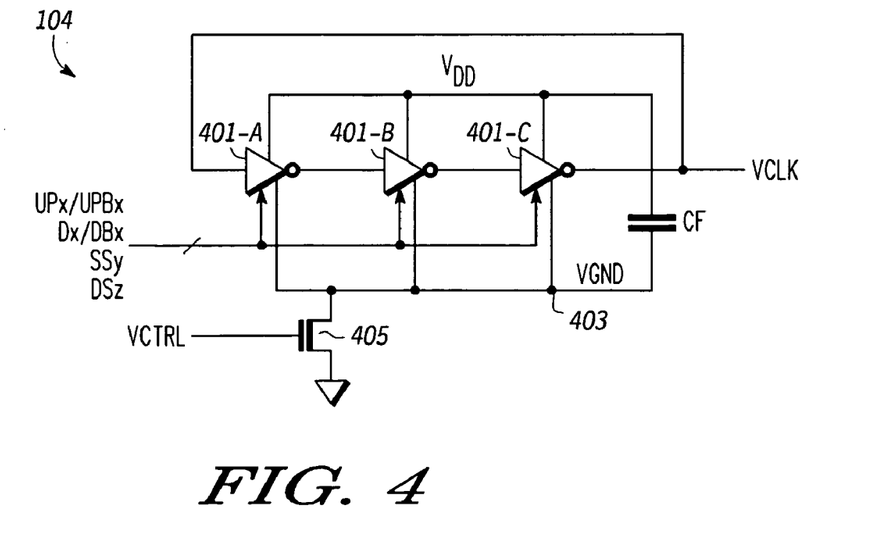
FIG. 4 is a simplified schematic and block diagram of the VCO of FIG. 1 implemented according to an exemplary embodiment of the present invention.

FIG. 4 is a simplified schematic and block diagram of the VCO 109 implemented according to an exemplary embodiment of the present invention. The particular configuration shown illustrates a multi-stage ring oscillator structure, which further includes embedded switched phase control devices. In the particular configuration illustrated in FIG. 4, the VCO 109 includes three stages, each implemented with an inverter 401 with programmable phase correction. It is appreciated by those of ordinary skill in the art that a different number of stages may be used as desired (e.g., 1 stage, 5 stages, 7 stages, etc.) and may be implemented with different types of devices other than inverters. A first programmable inverter 401-A has an input receiving the clock signal VCLK and an output coupled to the input of a second programmable inverter 401-B. The output of the programmable inverter 401-B is coupled to the input of a third programmable inverter 401-C, having an output providing the VCLK signal. Each of the programmable inverters 401-A–401-C is coupled between the supply voltage VDD and a virtual ground node 403 developing a virtual ground signal VGND. A decoupling capacitor CF is coupled between VDD and VGND. The VCTRL signal is provided to the gate of an N-channel transistor 405 having its drain coupled to node 403 and its source coupled to GND. Each of the programmable inverters 401 receive all or a selected combination of the UPx/UPBx and Dx/DBx clock control signals for programming phase as further described below. Also, for embodiments including programmable stages for phase control, the SSy signals are provided to the programmable inverters 401. Furthermore, for embodiments including programmable load capacitors, the DSz signals are provided to the programmable inverters 401.

In operation, when VCLK goes high, then the output of programmable inverter 401-A goes low after its delay, which causes the output of programmable inverter 401-B to go high after its delay, which causes the programmable inverter 401-C to pull VCLK low after its delay, which propagates back through the programmable inverters and operation oscillates in this manner. The programmable inverters 401 collectively operate at a frequency determined by their relative delays and by the VCTRL signal. As the voltage of VCTRL is increased, the transistor device 405 is turned more fully on reducing the voltage of VGND. As VGND is reduced, the effective voltage drop between VDD and VGND is increased, thereby increasing the frequency of the VCLK signal. And as the voltage of VCTRL is decreased, the transistor device 405 is turned more fully off increasing the voltage of VGND. As VGND is increased, the effective voltage drop across VDD and VGND is decreased, thereby reducing the frequency of the VCLK signal. The amount of delay of each of the programmable inverters 401 is programmed by all or selected ones of the UPx/UPBx and Dx/DBx clock control signals, thereby determining the relative phase of the VCLK signal.

Figure 5:
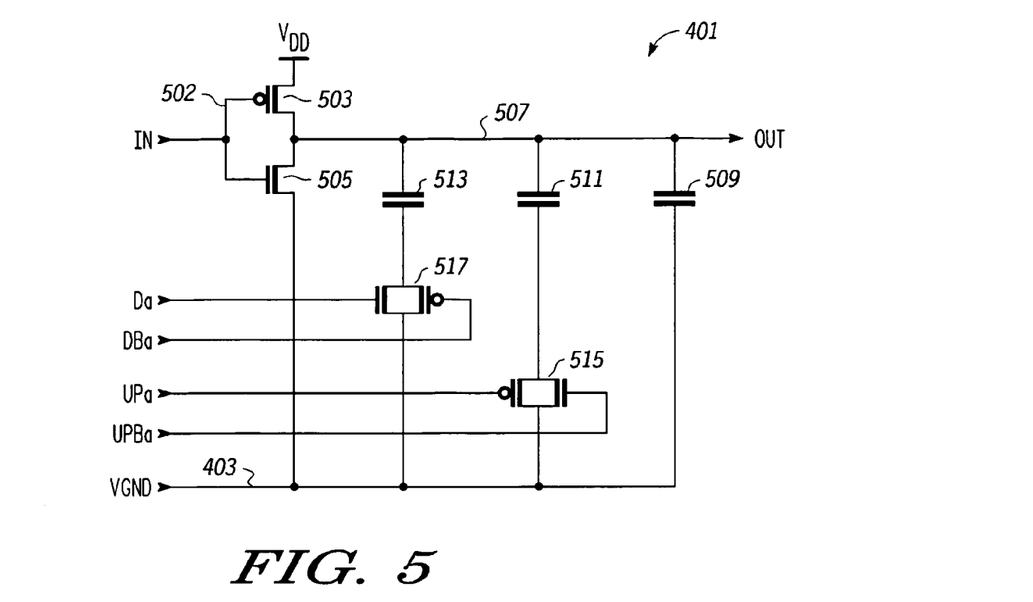
FIG. 5 is a schematic diagram of each of the programmable inverters of FIG. 4 implemented according to an exemplary embodiment of the present invention employing switched-capacitor phase compensation.

FIG. 5 is a schematic diagram of each of the programmable inverters 401 (including 401-A–401-C) implemented according to an exemplary embodiment of the present invention employing switched-capacitor phase compensation. An input node 502 is provided to the gates of a P-channel transistor 503 and an N-channel transistor 505. The source of transistor 503 is coupled to VDD and its drain is coupled to an output node 507, and the drain of transistor 505 is coupled to node 507 and its source is coupled to VGND. The transistors 503 and 505 form an inverter so that the signal on the output node 507 is inverted relative to the signal on the input node 502. A first capacitor 509 is coupled between node 507 and VGND. A second capacitor 511 has one terminal coupled to node 507 and its other terminal coupled to a switched terminal of a pass gate 515, having its other switched terminal coupled to VGND. A third capacitor 513 has one terminal coupled to node 507 and its other terminal coupled to a switched terminal of a pass gate 517, having its other switched terminal coupled to VGND.

Each pass gate shown and described herein includes a P-channel device and an N-channel device having their drain and sources coupled together (e.g., drain-to-source and source-to-drain) forming a pair of switched (or controlled, e.g., drain-source) terminals. The gates of the transistors form control terminals for turning on and off the pass device. Each pass gate is turned fully on when the gate of the N-channel device is pulled high and the gate of the P-channel device is pulled low, and is turned fully off when the gate of the N-channel device is pulled low and the gate of the P-channel device is pulled high. Thus, the control terminals of each pass gate receive complementary signals for switching the pass gate on and off. The pass gate 515 is controlled by a selected complementary pair of up clock control signals UPa and UPBa, and the pass gate 517 is controlled by a selected complementary pair of down clock control signals Da and DBa.

The "a" appended at the end of the signal name denotes a selected one of the "x" index values previously described. As an example, in one embodiment a is 0 for the inverter 401-A, a is 1 for the inverter 401-B and a is 2 for the inverter 401-C, so that the inverter 401-A receives the complementary pairs of up and down clock control signals UP0/UPB0 and D0/DB0, the inverter 401-B receives the complementary pairs of up and down clock control signals UP1/UPB1 and D1/DB1, and the inverter 401-C receives the complementary pairs of up and down clock control signals UP2/UPB2 and D2/DB2. In this manner, the phase delay of each of the inverters 401-A–401-C is controlled by a different complementary pair of clock control signals. In an alternative embodiment in which the phase delay modulator 105 is not used, all of the inverters 401-A–401-C are controlled by the same set of complementary pairs, e.g., the UP/UPB and D/DB signals from the PFD 103.

In operation of the programmable inverter 401 shown in FIG. 5, the capacitor 509 remains coupled between node 507 and VGND, the capacitor 511 is selectively coupled to VGND via pass gate 515 based on the UPa/UPBa signals, and the capacitor 513 is selectively coupled to VGND via pass gate 517 based on the Da/DBa signals. In particular, the capacitor 511 is decoupled (e.g., disconnected or removed) from VGND when the UPa signal is asserted high (and the UPBa signal is asserted low) and is coupled (e.g., connected, inserted) between node 507 and VGND when the UPa signal is asserted low (and the UPBa signal is asserted high). In a similar manner, the capacitor 513 is decoupled from VGND when the Da signal is asserted low (and the UPBa signal is asserted high) and is coupled between node 507 and VGND when the Da signal is asserted high (and the UPBa signal is asserted low). Each of the capacitors 509, 511 and 513, when coupled, cause additional delay when charging or discharging node 507 in response to input clock edges on the node 502 switching the transistors 503 and 505 to the alternative states, thereby inserted phase delay through the inverter. The amount of phase delay depends upon the relative size of the capacitors. The capacitor 511 is decoupled when the UPa signal is asserted high to reduce phase delay and the capacitor 513 is coupled when the Da signal is asserted high to increase phase delay. The magnitude of the increase or decrease in delay is determined by the capacitance ratio of the capacitors.

In one embodiment, the capacitors 509, 511 and 513 are metal capacitors having metal comb structure that spans multiple metal levels in an integrated circuit implementing phase locked loop 100. However, in other embodiments, the capacitors may be made from semiconductor transistors configured as capacitors, such as, for example, MOS transistors having their drains and sources coupled to their substrates to implement MOS capacitors.

Figure 6:
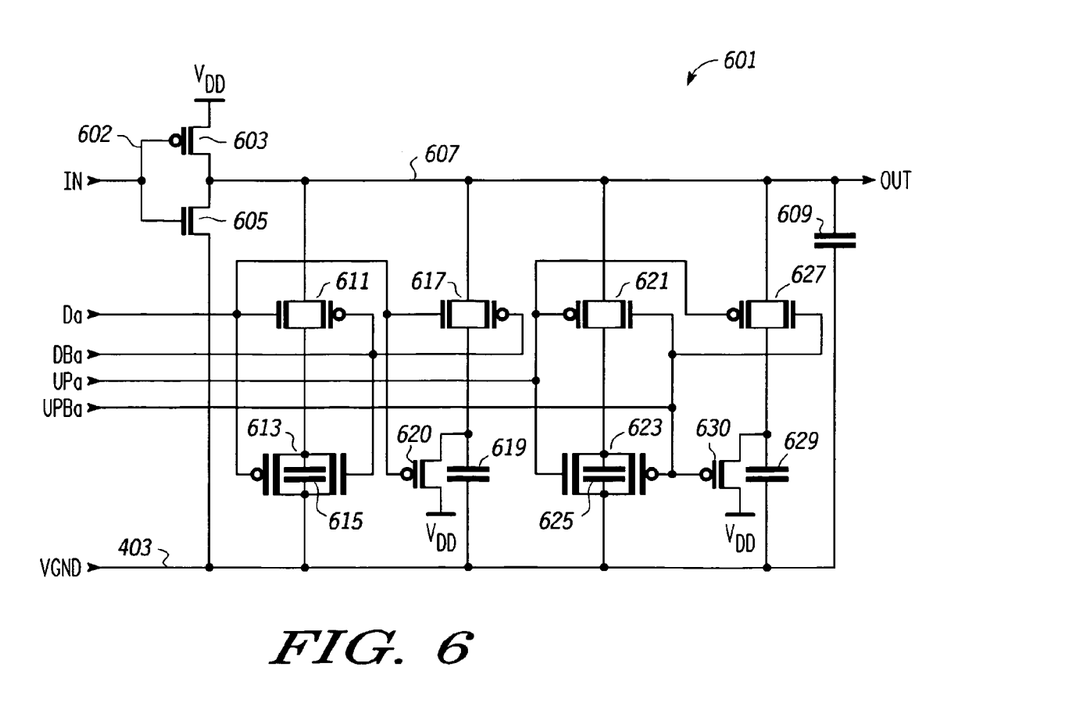
FIG. 6 is a schematic diagram of a programmable inverter implemented according to another exemplary embodiment of the present invention employing pre-charged switched-capacitor phase compensation that may be used as the inverters of FIG. 4.

FIG. 6 is a schematic diagram of a programmable inverter 601 implemented according to another exemplary embodiment of the present invention employing pre-charged switched-capacitor phase compensation. The inverter 601 may be used as any of the programmable inverters 401-A–401-C of FIG. 4 instead of the inverter 401 shown in FIG. 5. The inverter 601 includes input node 602, transistors 603 and 605, output node 607 and capacitor 609 each configured and coupled in substantially the same manner as the input node 502, transistors 503 and 505, output node 507 and capacitor 509, respectively, of the inverter 401 shown in FIG. 5. The inverter 601 includes a pass gate 611 having one switched terminal coupled to the node 607 and its other switched terminal coupled to the switched terminal of another pass gate 613, having its other switched terminal coupled to VGND. A capacitor 615 is coupled across the switched terminals of the pass gate 613. The inverter 601 further includes a pass gate 617 having switched terminals coupled between node 607 and a first terminal of a capacitor 619, having its other terminal coupled to VGND. A P-channel transistor 620 has a source coupled to VDD, a drain coupled to the junction between the pass gate 617 and the capacitor 619, and a gate receiving the Da signal. The Da and DBa signals are provided to the complementary switched terminals of the pass gates 611, 613 and 617, where the pass gate 613 is switched to opposite states as the pass gates 611 and 617. In a similar manner, the inverter 601 includes a pass gate 621 having one switched terminal coupled to the node 607 and its other switched terminal coupled to the switched terminal of another pass gate 623, having its other switched terminal coupled to VGND. A capacitor 625 is coupled between the switched terminals of the pass gate 623. The inverter 601 further includes a pass gate 627 having switched terminals coupled between node 607 and a first terminal of a capacitor 629, having its other terminal coupled to VGND. A P-channel transistor 630 has a source coupled to VDD, a drain coupled to the junction between the pass gate 627 and the capacitor 629, and a gate receiving the UPBa signal. The UPa and UPBa signals are provided to the complementary switch terminals of the pass gates 621, 623 and 627, where the pass gate 623 is switched to opposite states as the pass gates 621 and 627.

In operation of the inverter 601, when the Da signal is asserted low (and the DBa signal asserted high), the pass gates 611 and 617 are turned off, the pass gate 613 is turned on and the transistor 620 is turned on. The capacitor 615 is disconnected from node 607 and it is discharged by the pass gate 613. The capacitor 619 is also disconnected from the node 607 and it is pre-charged to a voltage equal to the difference between VDD and VGND. When the Da signal is asserted high (and the DBa signal asserted low), the pass gate 613 and the transistor 620 are both turned off while the pass gates 611 and 617 are both turned on connecting both the discharged capacitor 615 and the pre-charged capacitor 619 between node 607 and VGND. In a similar manner, when the UPa signal is asserted high (and the UPBa signal asserted low), the pass gates 621 and 627 are turned off, the pass gate 623 is turned on and the transistor 630 is turned on. The capacitor 625 is disconnected from node 607 and discharged by the pass gate 623. The capacitor 629 is also disconnected from the node 607 and it is pre-charged to a voltage equal to the difference between VDD and VGND. When the UPa signal is asserted low (and the UPBa signal asserted high), the pass gate 623 and the transistor 630 are both turned off while the pass gates 621 and 627 are both turned on connecting both the discharged capacitor 625 and the pre-charged capacitor 629 between node 607 and VGND. In this manner the down pulses tend to increase the phase delay of the inverter 601 (when Da is asserted high) whereas the up pulses tend to decrease the phase delay of the inverter 601 (when UPa is asserted high). Again, the magnitude of this increase or decrease in delay is determined by the ratio of the capacitors.

In one embodiment, the capacitors 615, 619, 623 and 629 are metal capacitors having metal comb structure that spans multiple metal levels in an integrated circuit implementing phase locked loop 100. However, in other embodiments, the capacitors may be made from semiconductor transistors configured as capacitors, such as, for example, MOS transistors having their drains and sources coupled to their substrates to implement MOS capacitors.

Figure 7:
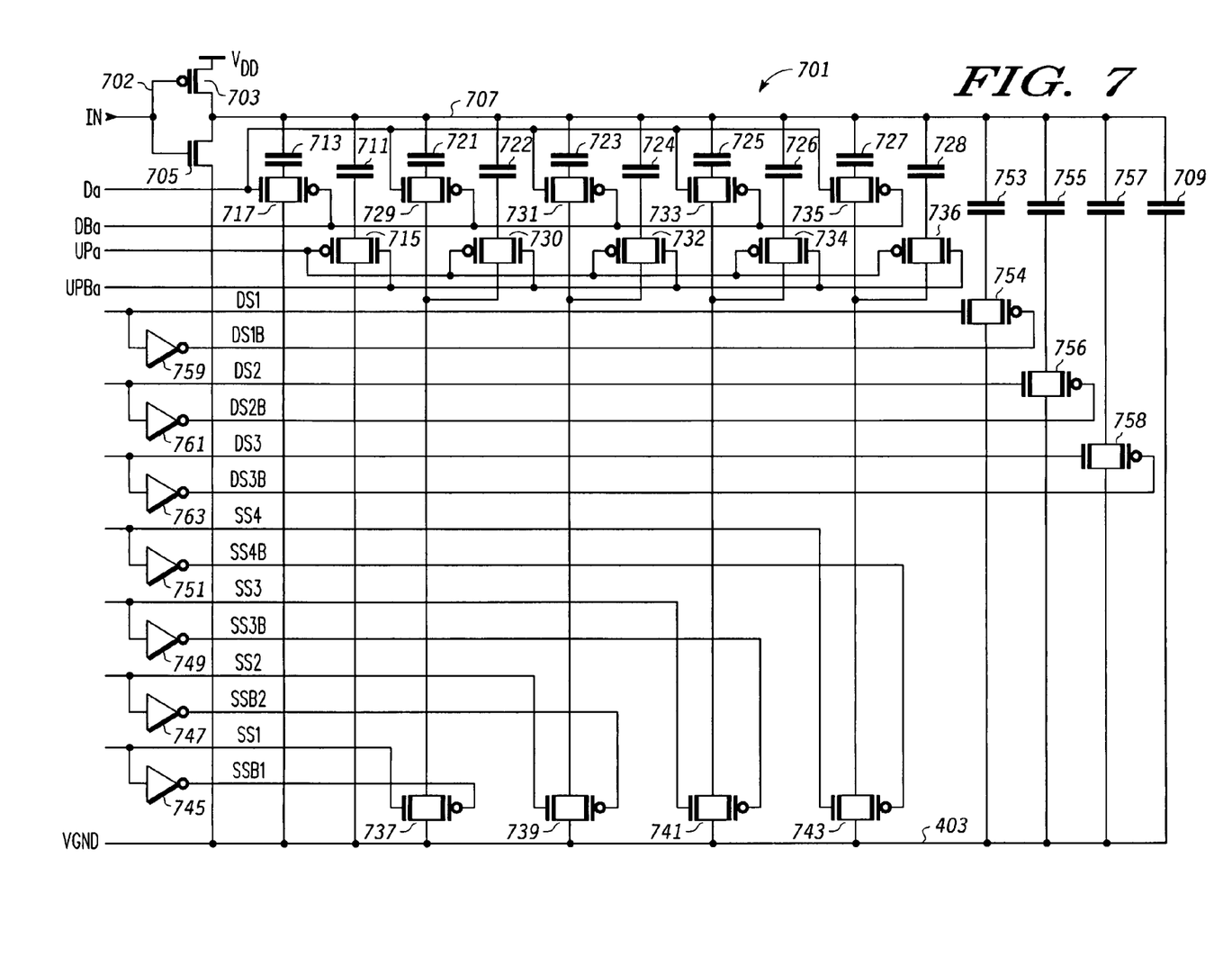
FIG. 7 is a schematic diagram of a programmable inverter implemented according to another exemplary embodiment of the present invention including switched-capacitor phase compensation that may be used as the inverters of FIG. 4.

FIG. 7 is a schematic diagram of a programmable inverter 701 implemented according to another exemplary embodiment of the present invention including switched-capacitor phase compensation. The programmable inverter 701 may be used as each of the programmable inverters 401-A, 401-B and 401-C of FIG. 4 instead of the configuration shown in FIG. 5 or 6. The programmable inverter 701 includes input node 702, transistors 703 and 705, output node 707 and capacitor 709 each configured and coupled in substantially the same manner as the input node 502, transistors 503 and 505, output node 507 and capacitor 509, respectively, of the inverter 401 shown in FIG. 5. The inverter 701 further includes capacitors 711 and 713 coupled to pass gates 715 and 717, respectively, coupled in substantially the same manner as the capacitors 511 and 513 and the pass gates 515 and 517 in which pass gate 715 is controlled by the up signals UPa and UPBa whereas the pass gate 717 is controlled by the down signals Da and DBa. Four additional up and down switched-capacitor stages are included. In particular, capacitors 721, 723, 725 and 727 are each coupled between node 707 and a corresponding switched terminal of pass gates 729, 731, 733 and 735, respectively, which are each controlled by the down signals Da and DBa. Also, capacitors 722, 724, 726 and 728 are each coupled between node 707 and a corresponding switched terminal of pass gates 730, 732, 734 and 736, respectively, which are controlled by the up signals UPa and UPBa. The other switched terminals of the pass gates 729 and 730 are coupled together and to a switched terminal of a pass gate 737, having its other switched terminal coupled to VGND. Similarly, the other switched terminals of pass gates 731 and 732 are coupled together and to a switched terminal of a pass gate 739, having its other switched terminal coupled to VGND; the other switched terminals of pass gates 733 and 734 are coupled together and to a switched terminal of a pass gate 741, having its other switched terminal coupled to VGND; and the other switched terminals of pass gates 735 and 736 are coupled to a switched terminal of a pass gate 743, having its other switched terminal coupled to VGND.

The pass gates 715 and 717 and corresponding capacitors 711 and 713 form a fixed stage. The pass gates 729 and 730 and corresponding capacitors 721 and 722 form a first programmable stage which is enabled by the pass gate 737, the pass gates 731 and 732 and corresponding capacitors 723 and 724 form a second programmable stage which is enabled by the pass gate 739, the pass gates 733 and 734 and corresponding capacitors 725 and 726 form a third programmable stage which is enabled by the pass gate 741, and the pass gates 735 and 736 and corresponding capacitors 727 and 728 form a fourth programmable stage which is enabled by the pass gate 743. Four stage select signals SS1, SS2, SS3 and SS4 (i.e., SSy, where y is an index from 1 to 4) are each provided to inverters 745, 747, 749 and 751 to provide complementary signals SS1B, SS2B, SS3B and SS4B, respectively. The complementary pairs SS1/SS1B, SS2/SS2B, SS3/SS3B and SS4/SS4B are provided to the control terminals of the pass gates 737, 739, 741 and 743, respectively, for separately and independently enabling each programmable stage.

The capacitor 709 is a fixed load capacitor in the embodiment shown. Three additional programmable load capacitor stages are provided with the inverter 701, including capacitors 753, 755 and 757, each coupled between the node 707 and to corresponding switched terminals of pass gates 754, 756, and 758, having their other switched terminals coupled to VGND. The pass gates 754, 756, and 758 selectively couple the capacitors 753, 755 and 757 to VGND based on complementary load capacitor select signal pairs DS1/DS1B, DS2/DS2B, DS3/DS3B and DS4/DS4B, where inverters 759, 761 and 763 receive the signals DS1, DS2 and DS3 to generate the signals DS1B, DS2B and DS3B, respectively. In this case, the programmable inverter 701 includes load capacitor select signals DSz, where z is an index from 1 to 4.

In operation of the programmable inverter 701, the capacitor pair 711/713 is controlled by the up and down signals in a similar manner as the capacitor pair 511/513. When the SS1 signal is asserted turning on pass gate 737, the capacitor pair 722/721 is added; when the SS2 signal is asserted turning on pass gate 739, the capacitor pair 724/723 is added; when the SS3 signal is asserted turning on pass gate 741, the capacitor pair 726/725 is added; and when the SS4 signal is asserted turning on pass gate 743, the capacitor pair 728/727 is added. The capacitances of the capacitors in each stage may be weighted in any suitable fashion, and any number of programmable switched-capacitor stages may be used for particular configurations to provide the desired degree of phase control. Also, any combination of the programmable load capacitors 753, 755 and 757 may be switched in via the DS1, DS2 and DS3 signals. Of course, these capacitors may be weighted in any manner (e.g., binary weighted) and additional programmable load capacitors may be added as desired. The digital select signals SS1–SS4 and DS1–DS3 may be asserted or controlled by external logic or latches as understood by those skilled in the art. The select signals may be statically controlled by a user or by logic, or may be dynamically configurable for a fully digitally programmed system.

In one embodiment, the capacitors 709, 711, 713, 721–728, 753, 755 and 757 are metal capacitors having metal comb structure that spans multiple metal levels in an integrated circuit implementing phase locked loop 100. However, in other embodiments, the capacitors may be made from semiconductor transistors configured as capacitors, such as, for example, MOS transistors having their drains and sources coupled to their substrates to implement MOS capacitors.

Figure 8:
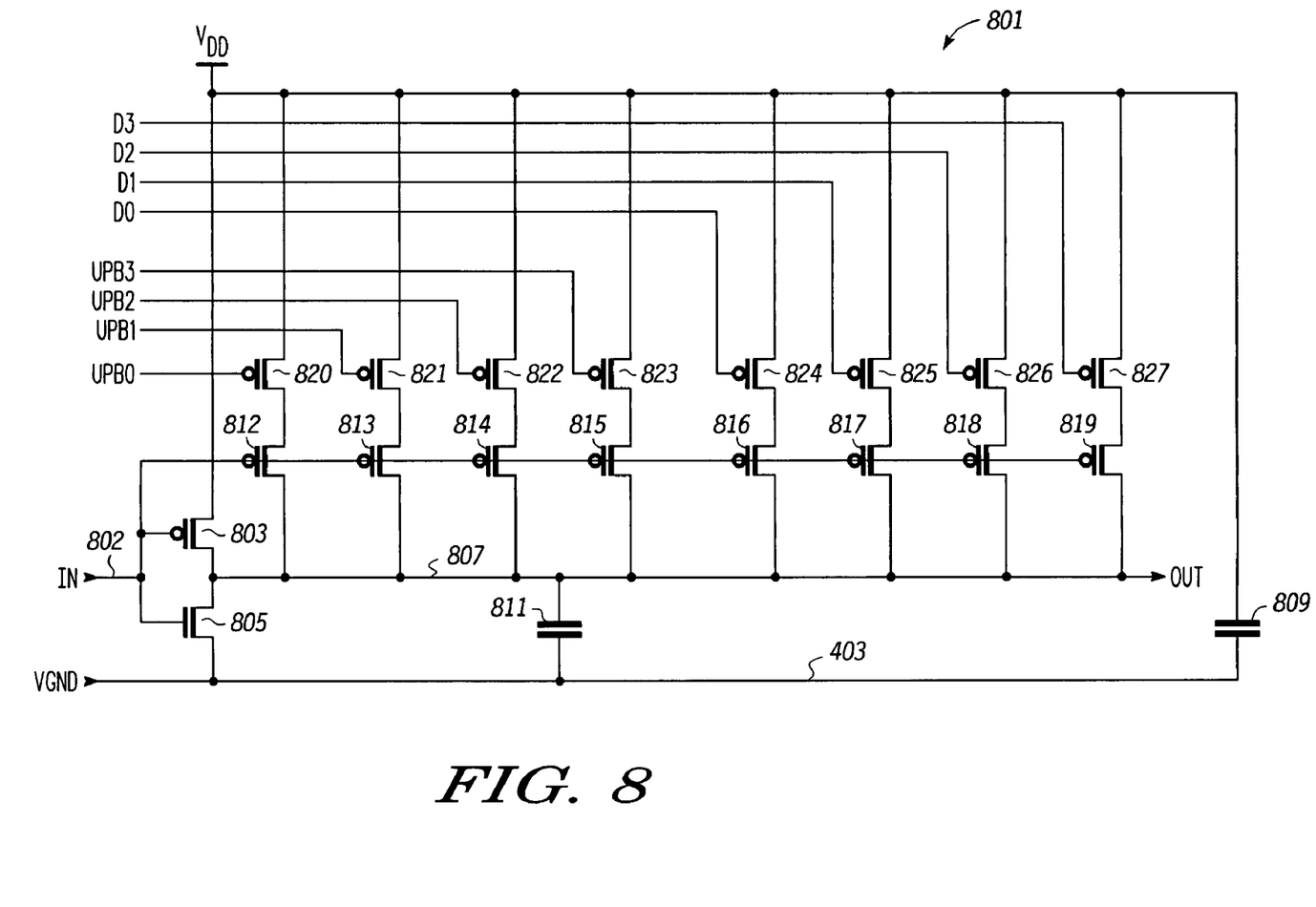
FIG. 8 is a schematic diagram of an inverter implemented according to another exemplary embodiment of the present invention including switched-transistor phase compensation that may be used as the inverters of FIG. 4.

FIG. 8 is a schematic diagram of an inverter 801 according to another exemplary embodiment of the present invention including switched-transistor phase compensation. The inverter 801 may be used as each of the inverters 401-A, 401-B and 401-C of FIG. 4 instead of the configuration shown in FIGS. 5, 6 or 7. The inverter 801 includes input node 802, transistors 803 and 805, output node 807 and capacitor 809 each configured and coupled in substantially the same manner as the input node 502, complementary transistors 503 and 505, output node 507 and capacitor 509, respectively, of the inverter 401 shown in FIG. 5. The inverter 801 also includes a capacitor 811 coupled between node 807 and VGND. A first set of P-channel transistors 812–819 each have their drains coupled to node 807 and a second set of P-channel transistor switches 820–827 each have their drains coupled to the source of a respective one of the first set of P-channel transistors 812–819. The sources of the switches 820–827 are coupled to VDD. The input node 802 is coupled to the gates of the transistors 812–819. The down control signals D0, D1, D2 and D3 are provided to the gates of the switches 824, 825, 826 and 827, respectively, and the up control signals UPB0, UPB1, UPB2 and UPB3 are provided to the gates of the switches 820, 821, 822 and 823, respectively.

In operation of the inverter 801, each of the transistors 812–819 is effectively placed in parallel with the transistor 803 when its corresponding switch 820–827 is turned on by a corresponding clock signal. Thus, for example, when the UPB0 signal is asserted low (indicating an up pulse on UP0) for an up pulse, then the switch 820 is turned on placing the transistor 812 in parallel with the transistor 803. Thus, both transistors 803 and 812 are turned on when the input node 802 is pulled low thereby tending to increase the speed of the rising edge on the output node 807. In contrast, when the D0 signal is asserted high for a down pulse, then the switch 824 is turned off thereby de-coupling the transistor 816 from being in parallel with the transistor 803, thereby tending to decrease the speed of the output rising edge. The transistors 812–819 are sized appropriately to achieve the desired dynamic phase correction during operation in response to the corresponding clock control signal.

A PLL implemented according to the present invention does not use traditional resistor or current source approaches which rely on accurate resistor and transistor requirements. The PLL uses programmable devices (e.g., capacitors or transistors) for at least-three functions including, level-shifting the system clock, multi-bandwidth control and switched-device techniques for phase correction. In one embodiment, both the damping coefficient and the natural frequency "Wn" are controlled by metal capacitor characteristics (such as capacitor ratios) which make the design scalable across technologies and even across metallization offerings within a given technology. The PLL includes a receiver circuit with a programmable AC interface that provides a seamless interface with a system clock at any one of a variety of voltage levels. The receiver does not rely on thick-gate devices or the like for voltage matching or skew control and does not slow down the faster feedback clock path. The receiver circuit further includes a state detection and correction circuit that ensures that the state of the level-shifted clock remains consistent with the input system or reference clock.

Those of skill in the art will recognize that, based upon the teachings herein, several modifications may be made to the embodiments shown and described herein. For example, multiple switched capacitors shown in the Figures may be implemented with other types of devices, such as variable capacitors or the like. Also, features shown or described with regard to one embodiment may be included in other embodiments shown or described herein. Also, the up and down clock control signals and select signals (e.g., load select, stage select, etc.) each include complementary forms (e.g., UPB/DB) used to control switches with complementary inputs (e.g., pass devices) as understood by those skilled in the art, where the primary signals may be used in alternative embodiments to control devices with single control inputs and alternative polarity devices may be employed where desired (e.g., P-channel versus N-channel).

A programmable PLL circuit according to the present invention includes a receiver circuit, a phase frequency detector circuit, a charge pump, and a VCO. In one aspect of the invention, the receiver circuit includes a programmable AC interface that level shifts voltage of a first clock relative to a second clock to provide a level-shifted third clock. The programmable AC interface may be a capacitor voltage divider, which includes a first metal capacitor with a first terminal receiving a reference clock and a second terminal developing a level-shifted clock, and one or more switched metal capacitors coupled to the second terminal of the first capacitor. A state detection and correction circuit is included to ensure proper state of the level-shifted clock relative to the reference clock.

In another aspect of the present invention, the programmable PLL includes a pulse delay modulator that receives the clock control signals and that provides delayed clock control signals. The delayed clock control signals are delayed and pulse width modulated versions of the complementary up and down clock control signals for increasing the resolution of the phase delay steps. The VCO includes a programmable phase control circuit that dynamically adjusts phase of its clock using the clock control signals and the delayed clock control signals. The second clock is based on the clock output of the VCO. The VCO circuit may include a ring oscillator circuit including a phase control node. The programmable phase control circuit selectively couples multiple devices to the phase control node based on the delayed clock control signals. The devices may be capacitors or transistors, each switched using switches controlled by the delayed clock control signals. The delayed clock control signals may include a delayed up signal and a delayed down signal for selectively coupling corresponding capacitors to or decoupling the capacitors from the phase control node. Selected capacitors may be discharged or pre-charged when decoupled from the phase control node, and a combination of both discharged and pre-charged capacitors is contemplated and disclosed. The capacitors and switches may be implemented into one or more stages, each stage enabled by a stage select signal controlling a switch. One or more programmable load capacitors may be included, each enabled or disabled by a load select signal and a switch. For transistor devices, one or more transistors are selectively coupled in parallel by the delayed clock control signals to increase or decrease phase.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A programmable phase locked loop (PLL) circuit, comprising:
    a receiver circuit that level shifts voltage of a first clock relative to a second clock to provide a level-shifted third clock and that provides a fourth clock based on said second clock, said receiver circuit providing said third and fourth clocks;
    a phase frequency detector circuit having first and second inputs to receive said third and fourth clocks, and a plurality of outputs providing a plurality of clock control signals based on a comparison between said third and fourth clocks;
    a pulse delay modulator that has a plurality of inputs that receive said plurality of clock control signals and a plurality of outputs that provide a plurality of delayed clock control signals;
    a charge pump having a plurality of inputs receiving said plurality of clock control signals and an output providing a frequency control voltage; and
    a voltage controlled oscillator (VCO) having a first input receiving said frequency control voltage, a plurality of second inputs receiving said plurality of clock control signals and said plurality of delayed clock control signals and an output providing a fifth clock having a frequency controlled by said frequency control voltage, said VCO including a programmable phase control circuit that dynamically adjusts phase of said fifth clock using said plurality of clock control signals and said plurality of delayed clock control signals;
    wherein said second clock is based on said fifth clock.

2. The programmable PLL circuit of claim 1, wherein said VCO comprises:
    a ring oscillator circuit comprising a phase control node; and
    wherein said programmable phase control circuit is operative to selectively couple a plurality of devices to said phase control node based on said plurality of delayed clock control signals.

3. The programmable PLL circuit of claim 2, wherein said programmable phase control circuit includes a plurality of capacitors coupled to a plurality of switches controlled by said plurality of delayed clock control signals.

4. The programmable PLL of claim 3, wherein each of said plurality of capacitors comprises a metal capacitor.

5. The programmable PLL circuit of claim 3, wherein said plurality of delayed clock control signals comprises a delayed up signal and a delayed down signal, wherein said plurality of switches comprises first and second switches, wherein said plurality of capacitors comprises first and second capacitors, wherein said first switch is controlled by said delayed up signal to selectively decouple said first capacitor from said phase control node, and wherein said second switch is controlled by said delayed down signal to selectively couple said first capacitor to said phase control node.

6. The programmable PLL circuit of claim 5, wherein said plurality of switches comprises a third switch, controlled by said delayed up signal, that discharges said first capacitor when it is decoupled from said phase control node, and a fourth switch, controlled by said delayed down signal, that discharges said second capacitor when it is decoupled from said phase control node.

7. The programmable PLL circuit of claim 5, wherein said plurality of switches includes a third switch, controlled by said delayed up signal, that pre-charges said first capacitor when decoupled from said phase control node, and a fourth switch, controlled by said delayed down signal, that pre-charges said second capacitor when it is decoupled from said phase control node.

8. The programmable PLL circuit of claim 5, wherein said plurality of switches comprises third, fourth, fifth, sixth, seventh and eighth switches, wherein said plurality of capacitors comprises third and fourth capacitors, wherein said third switch is controlled by said delayed up signal to selectively decouple said third capacitor from said phase control node, wherein said fourth switch is controlled by said delayed down signal to selectively couple said fourth capacitor to said phase control node, wherein said fifth switch is controlled by said delayed up signal to discharge said first capacitor when decoupled from said phase control node, wherein said sixth switch is controlled by said delayed down signal to discharge said second capacitor when decoupled from said phase control node, wherein said seventh switch is controlled by said delayed up signal to pre-charge said third capacitor when decoupled from said phase control node, and wherein said eighth switch is controlled by said delayed down signal to pre-charge said fourth capacitor when decoupled from said phase control node.

9. The programmable PLL circuit of claim 5, further comprising:
    said plurality of capacitors comprising third and fourth capacitors;
    said plurality of switches comprising a third switch enabled by a stage select signal; and
    said plurality of switches comprising a fourth switch controlled by said delayed up signal to selectively decouple said third capacitor from said phase control node when enabled by said third switch, and a fifth switch controlled by said delayed down signal to selectively couple said fourth capacitor to said phase control node when enabled by said third switch.

10. The programmable PLL circuit of claim 3, further comprising:
    said plurality of capacitors comprising first and second capacitors;
    said plurality of switches comprising a first switch enabled by a stage select signal; and
    said plurality of switches comprising a second switch controlled by said delayed up signal to selectively decouple said first capacitor from said phase control node when enabled by said first switch, and a third switch controlled by said delayed down signal to selectively couple said second capacitor to said phase control node when enabled by said first switch.

11. The programmable PLL circuit of claim 3, wherein said plurality of capacitors comprises a first capacitor coupled to a first switch which is controlled by a load select signal to selectively couple said first capacitor to said phase control node.

12. The programmable PLL circuit of claim 2, wherein said plurality of delayed clock control signals comprises a delayed up signal and a delayed down signal, and wherein said programmable phase control circuit comprises:

a first P-channel transistor having a source coupled to a first supply, a gate receiving an input clock signal and a drain coupled to an output node;

a first N-channel transistor having a source coupled to a virtual ground node, a gate coupled to said gate of said first P-channel transistor and a drain coupled to said output node;

a plurality of second P-channel transistors, each having a gate coupled to said gate of said first P-channel transistor, a drain coupled to said output node and a source;

a third P-channel transistor having a drain coupled to a source of a corresponding second P-channel transistor, a source coupled to said first supply, and a gate receiving said delayed up signal; and a fourth P-channel transistor having a drain coupled to a source of a corresponding second P-channel transistor, a source coupled to said first supply, and a gate receiving said delayed down signal.

13. The programmable PLL circuit of claim 2, wherein said plurality of clock control signals and said delayed clock control signals comprises a plurality of up signals and a plurality of down signals, and wherein said programmable phase control circuit comprises:

a first P-channel transistor having a source coupled to a first supply, a gate receiving an input clock signal and a drain coupled to an output node;

a first N-channel transistor having a source coupled to a virtual ground node, a gate coupled to said gate of said first P-channel transistor and a drain coupled to said output node;

a plurality of second P-channel transistors, each having a gate coupled to said gate of said first P-channel transistor, a drain coupled to said output node and a source;

a plurality of third P-channel transistors, each having a drain coupled to a source of a corresponding second P-channel transistor, a source coupled to said first supply, and a gate receiving a corresponding one of said plurality of up signals; and a plurality of fourth P-channel transistors, each having a drain coupled to a source of a corresponding second P-channel transistor, a source coupled to said first supply, and a gate receiving a corresponding one of said plurality of down signals.

14. The programmable PLL of claim 1, wherein:

said VCO comprises a ring oscillator circuit comprising first and second phase control nodes; and wherein said programmable phase control circuit selectively couples a first plurality of devices to said first phase control node based on said plurality of clock control signals and selectively couples a second plurality of devices to said second phase control node based on said plurality of delayed clock control signals.

15. The PLL of claim 14, wherein said first and second plurality of devices comprise capacitors and wherein said programmable phase control circuit comprises a plurality of switches, each of said plurality of switches for selectively coupling and decoupling a corresponding capacitor to a corresponding phase control node.

16. The PLL of claim 1, wherein said pulse delay modulator chops said plurality of delayed clock control signals relative to said plurality of clock control signals.

17. A programmable phase locked loop (PLL) circuit, comprising:

a receiver circuit comprising a programmable AC interface that level shifts voltage of a reference clock relative to a feedback clock to provide a level-shifted clock and that provides a buffered clock based on said feedback clock, said receiver circuit providing said buffered and level-shifted clocks;

a phase frequency detector circuit having first and second inputs to receive said buffered and level-shifted clocks, and a plurality of outputs providing a plurality of clock control signals based on a comparison between said buffered and level-shifted clocks;

a pulse delay modulator that has a plurality of inputs that receive said plurality of clock control signals and a plurality of outputs that provide a plurality of delayed clock control signals;

a charge pump having a plurality of inputs receiving said plurality of clock control signals and an output providing a frequency control voltage; and a voltage controlled oscillator (VCO) having a first input receiving said frequency control voltage, a plurality of second inputs receiving said plurality of clock control signals and said plurality of delayed clock control signals and an output providing an output clock having a frequency controlled by said frequency control voltage and used to develop said feedback clock, said VCO including a programmable phase control circuit receiving said plurality of clock control signals and said plurality of delayed clock control signals for dynamically adjusting phase of said feedback clock.

18. The programmable PLL of claim 17, wherein said programmable AC interface comprises a capacitive voltage divider, wherein said VCO comprises a ring oscillator circuit including at least one phase control node, and wherein said programmable phase control circuit selectively couples a plurality of devices to said at least one phase control node based on said plurality of clock control signals and said plurality of delayed clock control signals.

19. The programmable PLL of claim 18, further comprising:

wherein said VCO comprises a plurality of delay devices with a plurality of phase control nodes; and wherein said programmable phase control circuit selectively couples a first plurality of devices to a first phase control node based on said plurality of clock control signals and selectively couples a second plurality of devices to a second phase control node based on said plurality of delayed clock control signals.

20. The programmable PLL of claim 18, wherein said capacitive voltage divider comprises a first metal capacitor with a first terminal receiving said reference clock and a second terminal developing said level-shifted clock, and a plurality of switched metal capacitors coupled to said second terminal of said first capacitor, and further comprising a state detection and correction circuit that ensures proper state of said level-shifted clock relative to said reference clock.

21. A programmable phase locked loop (PLL) circuit, comprising:

a receiver circuit comprising a capacitive voltage divider that level shifts voltage of a first clock relative to a second clock to provide a level-shifted third clock and that provides a fourth clock based on said second clock, said receiver circuit providing said third and fourth clocks;

a state detection and correction circuit that ensures proper state of said level-shifted clock relative to said first clock;

a phase frequency detector circuit having first and second inputs to receive said third and fourth clocks, and a plurality of outputs to provide a plurality of clock control signals based on a comparison between said third and fourth clocks;

a charge pump having a plurality of inputs receiving said plurality of clock control signals and an output providing a frequency control voltage; and a voltage controlled oscillator (VCO) having a first input receiving said frequency control voltage, a plurality of second inputs receiving said plurality of clock control signals and an output providing a fifth clock having a frequency controlled by said frequency control voltage;

wherein said second clock is based on said fifth clock.

22. A method of level-shifting and controlling phase in a phase locked loop, comprising:

coupling a reference clock to a first terminal of a first capacitor;

selecting from among a plurality of second capacitors coupled to a second terminal of the first capacitor to level-shift the reference clock to a selected voltage level;

detecting phase and frequency relationship between the level-shifted reference clock and a first clock and providing clock control signals;

delaying the clock control signals and providing delayed clock control signals;

controlling charge of a third capacitor based on the clock control signals;

generating a second clock having a frequency based on the charge of the third capacitor;

adjusting phase of the second clock using the clock control and delayed clock control signals; and generating the first clock based on the second clock.

23. The method of claim 22, further comprising detecting a state of the reference clock and correcting a state of the level-shifted reference clock.

24. The method of claim 22, further comprising pulse width modulating the delayed clock control signals.

25. The method of claim 22, wherein said adjusting phase of the second clock comprises selectively coupling of a plurality of devices to at least one phase control node using the clock control and delayed clock control signals.

26. The method of claim 22, wherein said adjusting phase of the second clock comprises:

selectively coupling of a plurality of devices of a plurality of stages to at least one phase control node using the clock control and delayed clock control signals; and controlling stage select signals to selectively enable each of the plurality of stages.

27. The method of claim 22, wherein said adjusting phase of the second clock comprises controlling load select signals to selectively couple each of a plurality of load capacitors.

28. The method of claim 22, wherein said adjusting phase of the second clock comprises:

selectively coupling a fourth capacitor to a phase control node based on an up pulse clock control signal; and selectively decoupling a fifth capacitor to the phase control node based on a down pulse clock control signal.

29. The method of claim 28, wherein said adjusting phase of the second clock further comprises discharging each of said fourth and fifth capacitors when decoupled from the phase control node.

30. The method of claim 28, wherein said adjusting phase of the second clock further comprises pre-charging each of said fourth and fifth capacitors when decoupled from the phase control node.

* * * * *

UNITED STATES PATENT AND TRADEMARK OFFICE
CERTIFICATE OF CORRECTION

| | | |
|---|---|---|
| PATENT NO. | : 7,135,934 B2 | Page 1 of 1 |
| APPLICATION NO. | : 11/069664 | |
| DATED | : November 14, 2006 | |
| INVENTOR(S) | : Hector Sanchez et al. | |

It is certified that error appears in the above-identified patent and that said Letters Patent is hereby corrected as shown below:

On the title page: Item [75] should read -- Xinghai Tang, Cedar Park, TX (CN) --.

Signed and Sealed this

Twentieth Day of February, 2007

JON W. DUDAS
*Director of the United States Patent and Trademark Office*